US007193542B2

(12) United States Patent
Jegou et al.

(10) Patent No.: US 7,193,542 B2
(45) Date of Patent: Mar. 20, 2007

(54) DIGITAL DATA COMPRESSION ROBUST RELATIVE TO TRANSMISSION NOISE

(75) Inventors: Hervé Jegou, Bohars (FR); Christine Guillemot, Chantepie (FR)

(73) Assignee: Inria Institut National de Recherche en Informatique et en Automatique, Le Chesnay Cedex (FR)

(*) Notice: Subject to any disclaimer, the term of this patent is extended or adjusted under 35 U.S.C. 154(b) by 0 days.

(21) Appl. No.: 10/521,963

(22) PCT Filed: Jul. 16, 2003

(86) PCT No.: PCT/FR03/02245

§ 371 (c)(1), (2), (4) Date: Aug. 8, 2005

(87) PCT Pub. No.: WO2004/012339

PCT Pub. Date: Feb. 5, 2004

(65) Prior Publication Data

US 2006/0125660 A1 Jun. 15, 2006

(30) Foreign Application Priority Data

Jul. 22, 2002 (FR) .................................. 02 09287
Nov. 28, 2002 (FR) .................................. 02 14964

(51) Int. Cl.
*H03M 7/40* (2006.01)

(52) U.S. Cl. .................... 341/67; 375/240.23; 382/247

(58) Field of Classification Search .................. 341/65, 341/67, 107; 375/240.23; 382/246, 247
See application file for complete search history.

(56) References Cited

U.S. PATENT DOCUMENTS 5,298,896 A 3/1994 Lei et al.
5,884,269 A 3/1999 Cellier et al.
6,020,923 A 2/2000 Hosaka et al.
6,055,273 A * 4/2000 Isomura ...................... 375/240
6,449,394 B1 * 9/2002 Florencio ..................... 341/67

FOREIGN PATENT DOCUMENTS

EP 1 067 694 A2 1/2001

* cited by examiner

*Primary Examiner*—Howard L. Williams
(74) *Attorney, Agent, or Firm*—Foley & Lardner LLP

(57) ABSTRACT

The invention concerns a digital data compression encoder, characterized in that it comprises: an input for a first data flow ($S_H$), and a second data flow ($S_L$), an encoding module, matching symbols of the first data flow, and code words, wherein, for certain symbols, there exist several words, called redundant, corresponding to the same symbol, and a processing module for encoding the symbols of the first data flow based on the correspondence, by selecting among the redundant words, on the basis of at least part of the second data flow.

18 Claims, 9 Drawing Sheets

11_A 12_A 13_A 14_A 15_A 16_A 1

A

Figure 1:
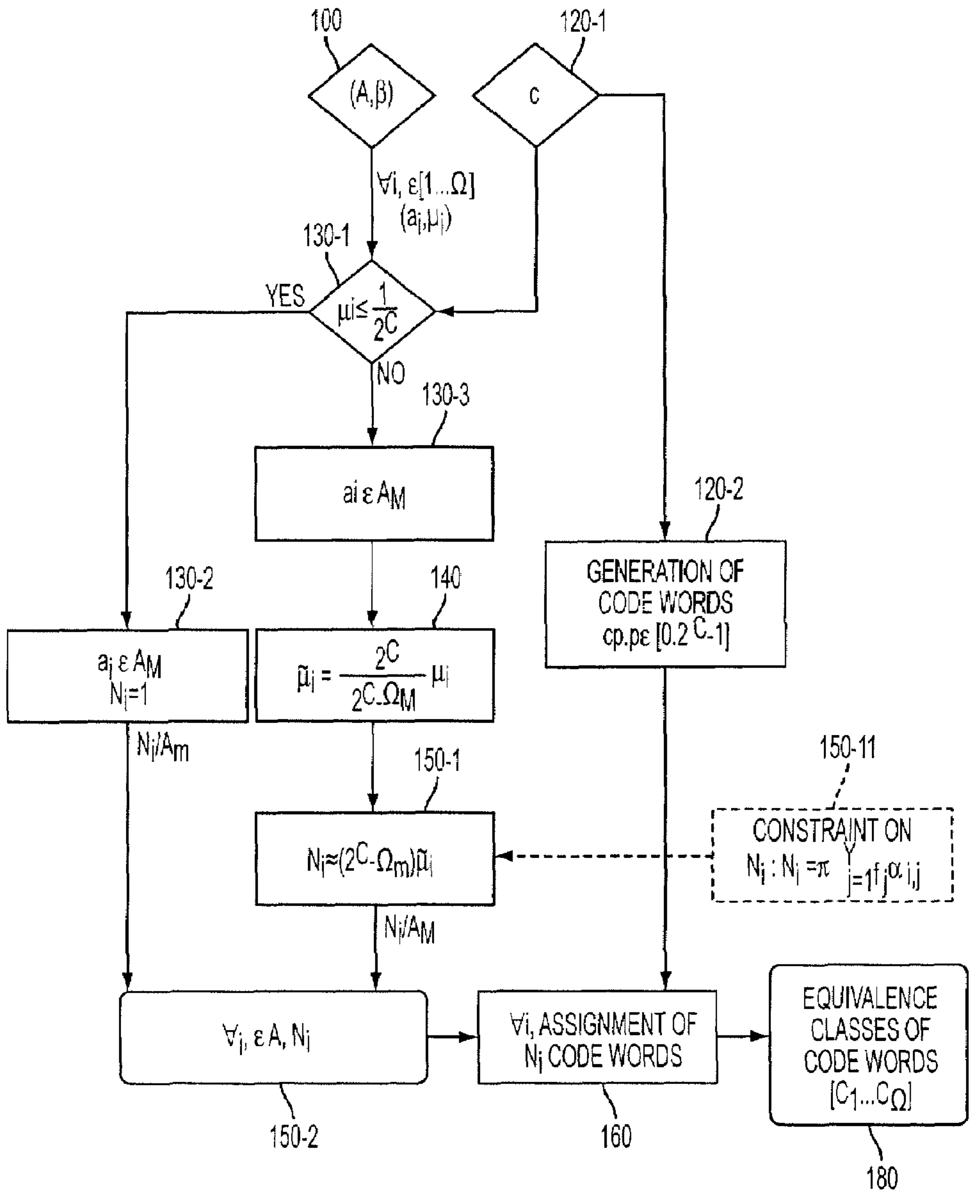

| CLASS $C_i$ | CODE WORD $C_{i,q}$ | SYMBOL $a_i$ | $N_i$=CARD ($C_i$) | PROBABILITY $\mu_i$ | STATE q |
|---|---|---|---|---|---|
| $C_1$ | 0000 | a | 6 | 0.43 | 0 |
| | 0001 | | | | 1 |
| | 0010 | | | | 2 |
| | 0011 | | | | 3 |
| | 0100 | | | | 4 |
| | 0101 | | | | 5 |
| $C_2$ | 0110 | b | 5 | 0.30 | 0 |
| | 0111 | | | | 1 |
| | 1000 | | | | 2 |
| | 1001 | | | | 3 |
| | 1010 | | | | 4 |
| $C_3$ | 1011 | c | 4 | 0.25 | 0 |
| | 1100 | | | | 1 |
| | 1101 | | | | 2 |
| | 1110 | | | | 3 |
| $C_4$ | 1111 | d | 1 | 0.02 | 0 |

11-B 12-B 13-B 18-B 14-B 15-B 17-B

B

| CLASS $C_i$ | $C_i,\overline{U_i}$ | $a_i$ | $D_i$ | $N_i=Z^1i$ | $\mu_i$ | $\overline{U_i}$ |
|---|---|---|---|---|---|---|
| $C_1$ | 000<br>001 | $a_1$ | 1 | 2 | 0.30 | 0<br>1 |
| $C_2$ | 010<br>011<br>100<br>101 | $a_2$ | 2 | 4 | 0.43 | 00<br>01<br>10<br>11 |
| $C_3$ | 110 | $a_3$ | 0 | 1 | 0.25 | Ø |
| $C_4$ | 111 | $a_4$ | 0 | 1 | 0.02 | Ø |

| $S_t$ | $a_2$ | $a_1$ | $a_1$ | $a_3$ | $a_1$ | $a_2$ | $a_1$ | $a_4$ | $a_2$ | $a_1$ |
|---|---|---|---|---|---|---|---|---|---|---|
| PREFIX | 10 | 0.. | 0.. | 110 | 0... | 10. | 0.. | 111 | 10. | 0.. |
| SUFFIX $\overline{U_t}$ | ..0 | ..10 | .10 | ... | .10 | .1 | .01 | ... | ..0 | .10 |
| $m_t$ | 100 | 010 | 010 | 110 | 010 | 101 | 001 | 111 | 100 | 010 |

31 32 33 34 35

C

| $T_Z$ IDENTIFIER | $U_{T_Z}$ | $V_{T_{Z,1}}$ | $V_{T_{Z,2}}$ | $V_{T_{Z,3}}$ | $O_{T_Z}$ |
|---|---|---|---|---|---|
| $T_0$ | 1 | 1 | 0 | 0 | 0.0000 |
| $T_1$ | 15 | 0 | 8 | 1 | 0.0001 |
| $T_2$ | 21 | 0 | 3 | 7 | 0.0004 |
| $T_3$ | 19 | 0 | 12 | 0 | 0.0010 |
| $T_4$ | 25 | 0 | 7 | 6 | 0.0011 |
| $T_5$ | 24 | 0 | 2 | 9 | 0.0028 |
| $T_6$ | 14 | 0 | 3 | 4 | 0.0030 |
| $T_7$ | 18 | 0 | 7 | 3 | 0.0034 |
| $T_8$ | 27 | 0 | 1 | 11 | 0.0047 |
| $T_9$ | 17 | 0 | 2 | 6 | 0.0060 |
| $T_{10}$ | 30 | 0 | 0 | 13 | 0.0062 |
| $T_{11}$ | 20 | 0 | 1 | 8 | 0.0080 |
| $T_{12}$ | 11 | 0 | 7 | 0 | 0.0086 |
| $T_{13}$ | 23 | 0 | 0 | 10 | 0.0095 |
| $T_{14}$ | 6 | 0 | 1 | 2 | 0.0381 |
| $T_{15}$ | 3 | 0 | 2 | 0 | 0.0566 |
| $T_{16}$ | 2 | 0 | 0 | 1 | 0.1610 |
| $T_{Z_{max}}=T_{17}$ | 1 | 0 | 1 | 0 | 0.5850 |

DIGITAL DATA COMPRESSION ROBUST RELATIVE TO TRANSMISSION NOISE

The present application is a national phase of International Application No. PCT/FR03/002245, filed Jul. 16, 2003, which claims priority to French Patent Application No. 02/09287, filed Jul. 22, 2002 and French Patent Application No. 02/14964, filed Nov. 28, 2002, all herein, incorporated by reference in their entirety.

The invention relates to digital data compression, in particular for multimedia signals (audio, image, video, voice), and the robust transmission of this data on noisy networks, such as wireless and mobile communications networks.

To reduce the transmission rate of digital data, it is compressed, seeking at the same time to approach the theoretical maximum that specialists refer to as "signal entropy". To do this, use is often made of statistical codes also termed variable length codes, for example Huffman codes. However, these codes have the drawback of being very, sensitive to transmission errors. Inversion of a bit can lead to de-synchronization of the decoder, which results in erroneous decoding of all the data following the position of the erroneous bit.

Existing solutions for the compression, transmission and decompression of multimedia signals over a network, to which further reference will be made, are based on the hypothesis that a certain quality of data transport service is guaranteed. In other words they assume that, by relying on the use of correction codes, the transport and link layers will make it possible to achieve a quasi-null residual error rate (i.e. seen by the compression and decompression application). But this hypothesis of quasi-null residual error rate no longer holds true when the channel characteristics vary over time (non-stationary charnels), in particular in wireless and mobile networks, and for a realistic complexity of the channel code. Furthermore, the addition of redundancy by correction codes leads to a reduction of the effective data rate.

There is therefore a need for solutions that are robust relative to transmission noise, i.e. that are little affected by the bit errors induced by this noise on the one hand, and which facilitate optimal use of the bandwidth (i.e. the capacity) of the network on the other hand.

The present invention proposes some advances in this area.

In one of its aspects, the invention discloses a digital data compression encoder, which includes:
- an input (physical or otherwise) for a first data flow, and a second data flow,
- an encoding module, matching symbols of the first data flow and code words, wherein, for certain symbols, there exist several words, called redundant, corresponding to the same symbol, and
- a processing module for encoding the symbols of the first data flow based on the match, by selecting among the redundant words, on the basis of at least part of the second data flow.

In various other aspects:
the code words can be of fixed length,
the processing module includes:
  - a function to calculate the current multiplexing capacity of the first data flow, based on the coding table, and
  - a function to extract a multiplexed part from the second data flow, determined on the basis of the current multiplexing capacity, to be carried by said redundant words.

the encoder includes a transformation of a binary flow into a multi-valued variable flow, in particular using the transformations described in Table C below.

as a variant, the encoder includes a transformation of a binary flow into a multi-valued variable flow, in particular using a generalized Euclidian decomposition based on a global variable given by the formula (E9) described below.

In a first variant:
the encoding module includes a coding table and the processing module includes:
  - a function for reading a multiplexing capacity of each current symbol of the first data flow based on the coding table, and
  - a function for extraction of a part of the second data flow determined from the multiplexing capacity, to be carried by said redundant words,
the coding table includes for each symbol an associated number of code words equal to a power of 2.

In a second variant:
the encoding module includes a binary encoding tree containing, for each symbol of the first data flow, a first code word part, of variable length and shorter than a maximum length, and the processing module includes:
  - a function to calculate the multiplexing capacity for each current symbol of the first data flow based on the first code word part of each symbol,
  - a function to extract a part of the second data flow determined from the multiplexing capacity, to be carried by said redundant words.

as a variant, each symbol comprises a sequence of symbols.

In a third variant:
each symbol includes a sequence of symbols, and the encoding module includes an arithmetic encoder capable of calculating, for a sequence of symbols of the first data flow, a first code word part of variable length and shorter than a maximum length; the processing module includes:
  - a function to calculate the multiplexing capacity for each current symbol of the first data flow based on the first code word part of each symbol,
  - a function to extract a part of the second data flow determined from the multiplexing capacity for each symbol, to be carried by said redundant words.

In the second and third variant, said part of the second data flow is concatenated to the first code word part up to the maximum code word length.

In a general manner:
the second data flow is pre-encoded.
the rest of the second data flow is concatenated to the transmitted data.

The invention also discloses a decoder capable of performing the inverse or reciprocal operations relative to those of the encoder in its different aspects.

The invention also discloses a digital data compression method that includes the following steps:
a. establishing a match between symbols of the first data flow and code words, wherein, for certain symbols, there exist several words, termed redundant, corresponding to the same symbol, and
b. encoding the symbols of a first data flow based on step a., by selecting among the redundant words, on the basis of at least part of a second data flow.

This method can incorporate other aspects of encoding.

In addition, the invention also discloses a digital data decompression process, including steps reciprocal to those of the compression process.

Figures 2, 2A:
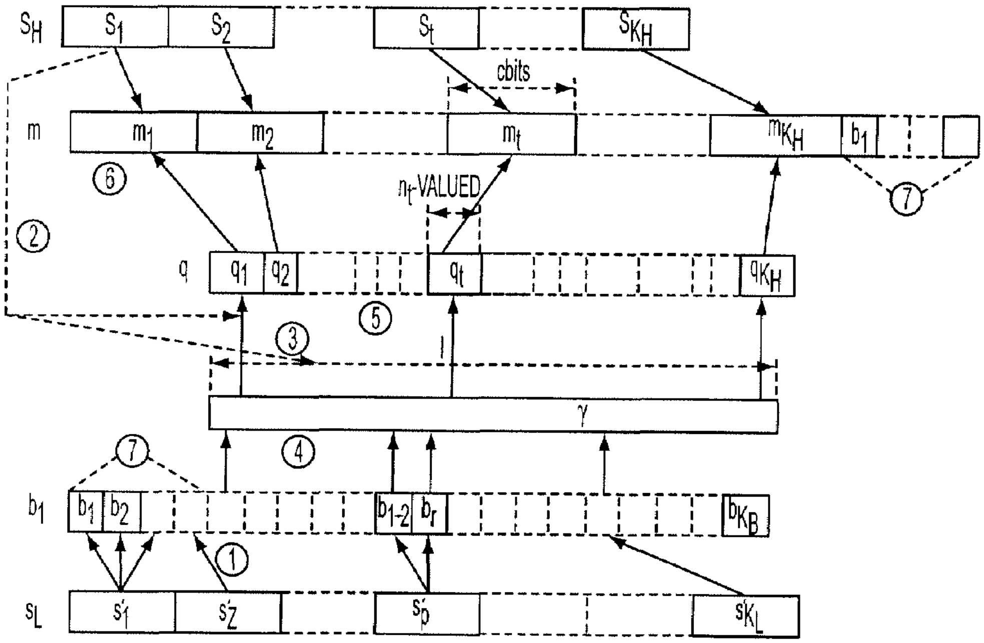
Figures 2B, 7, 10:
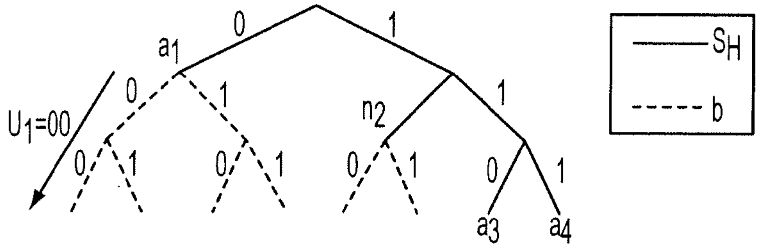
Figure 3:
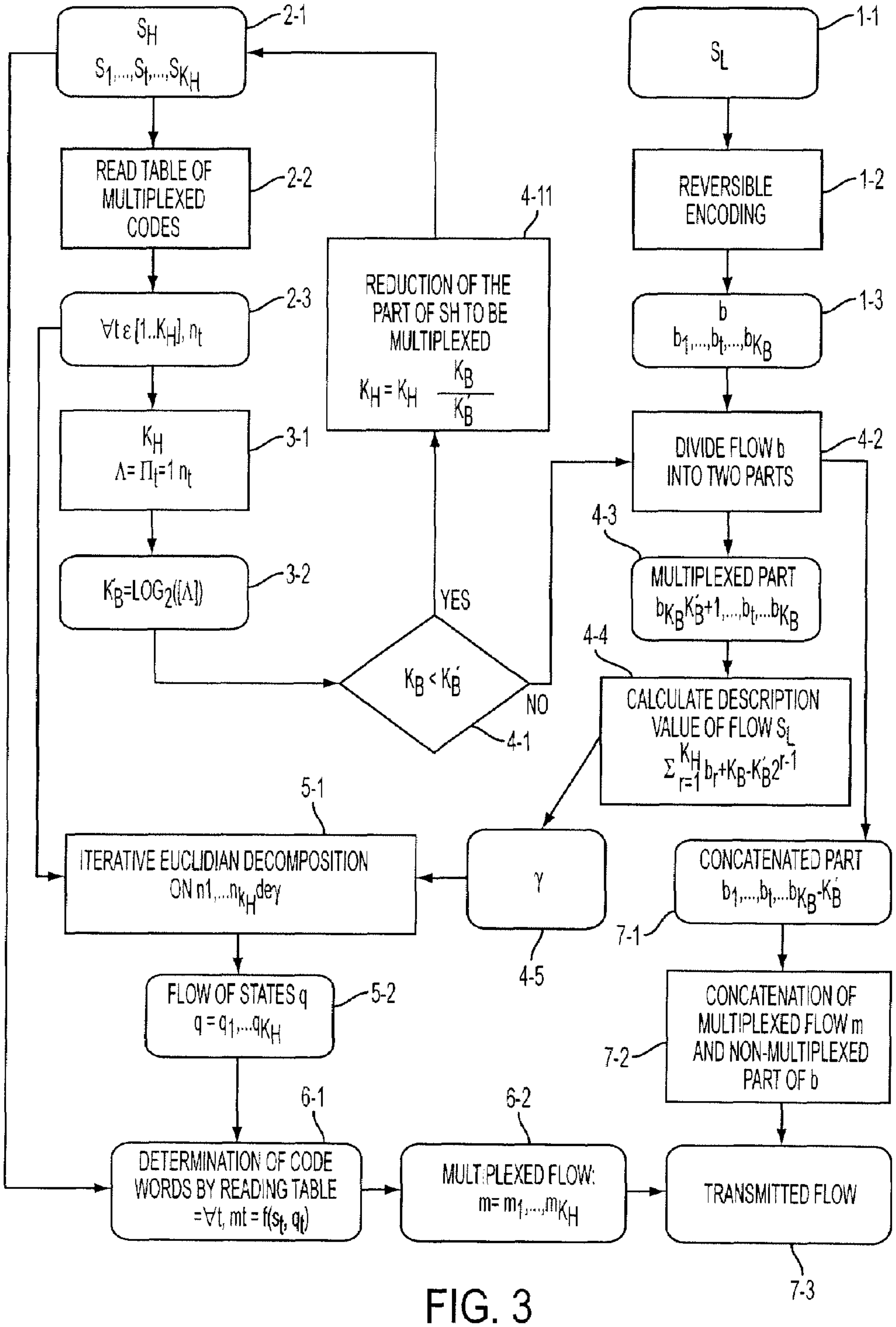
Figure 4:
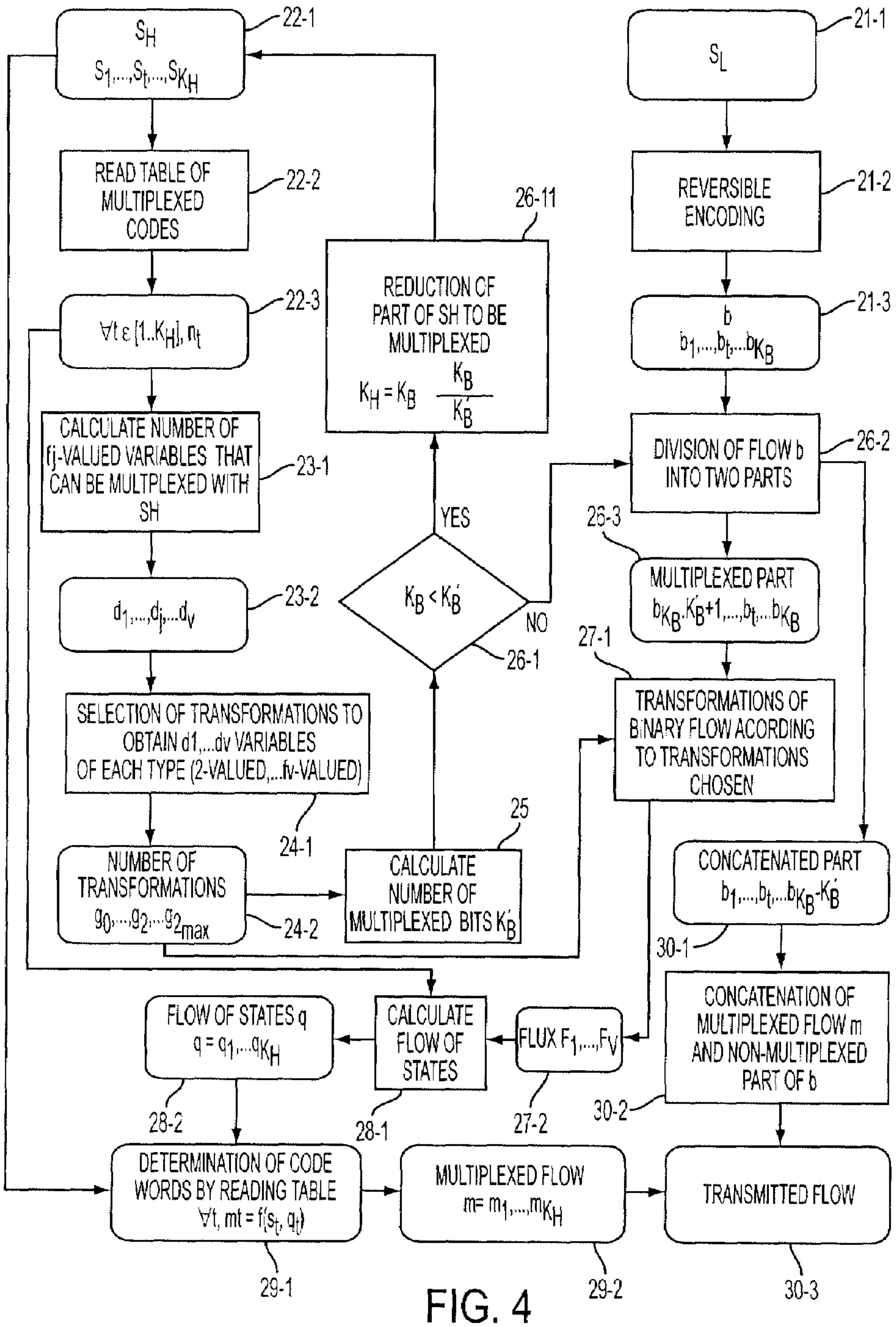
Figures 5, 6:
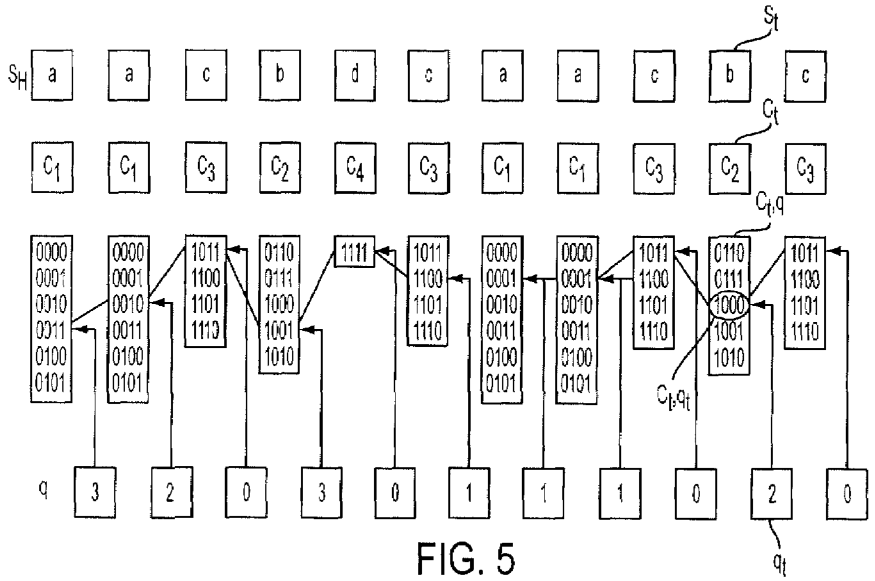
Figure 8:
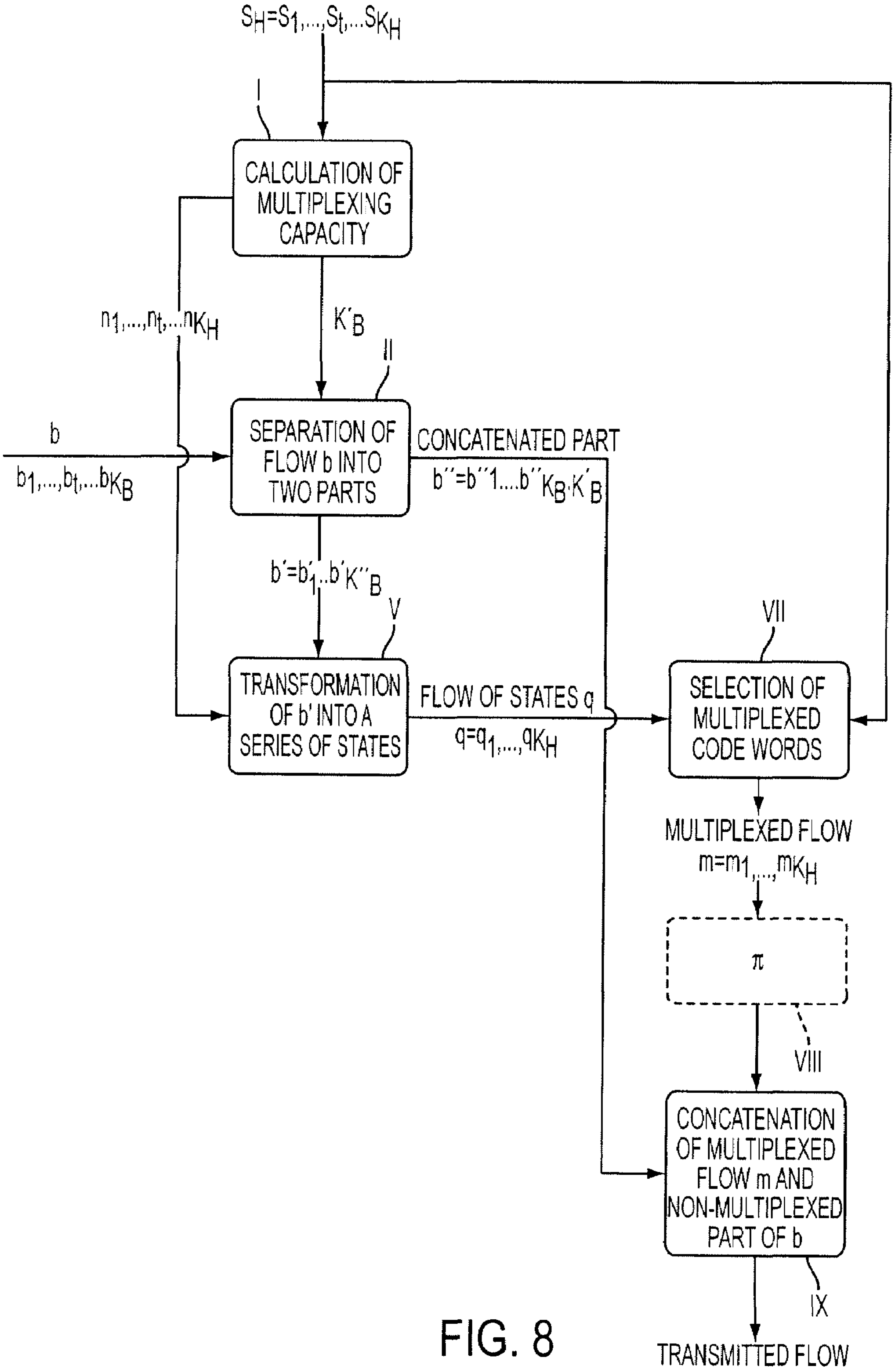
Figure 9:
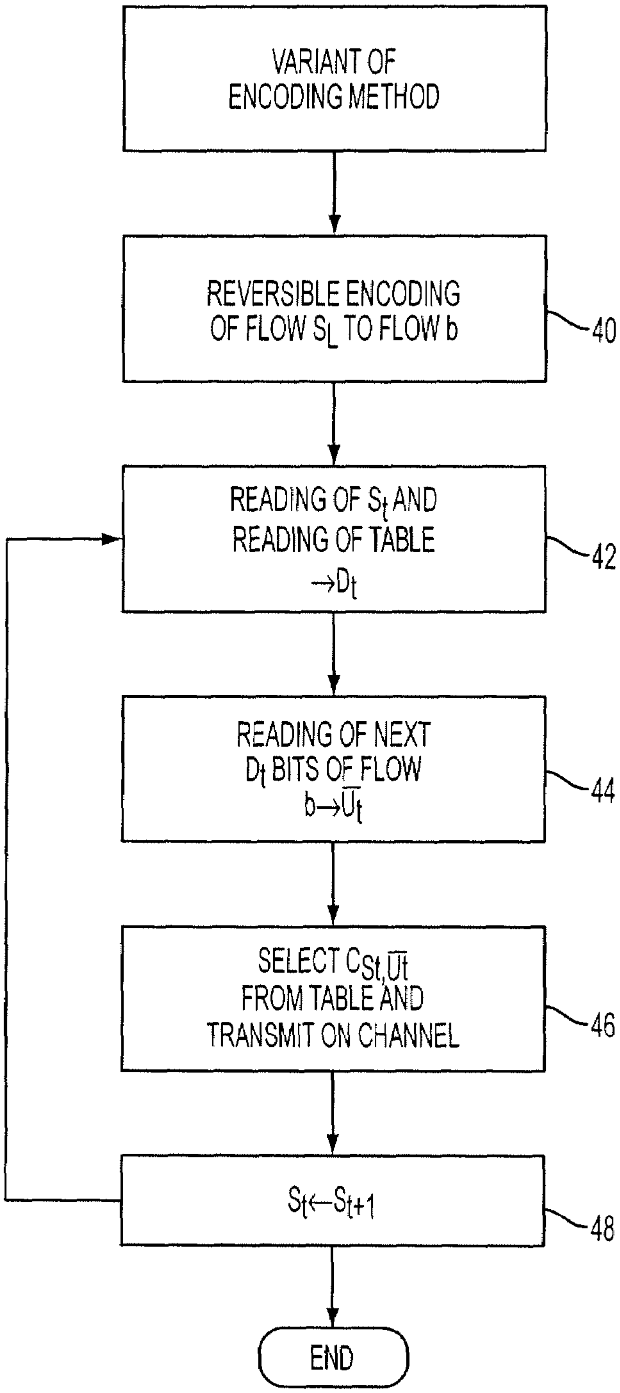
Figure 11:
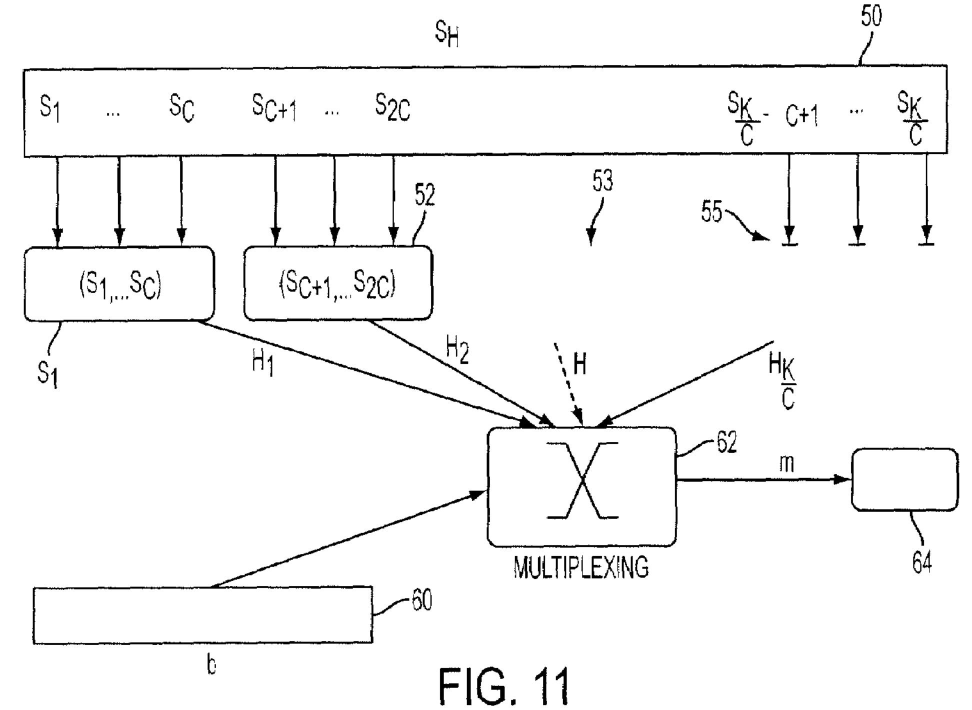
Figure 12:
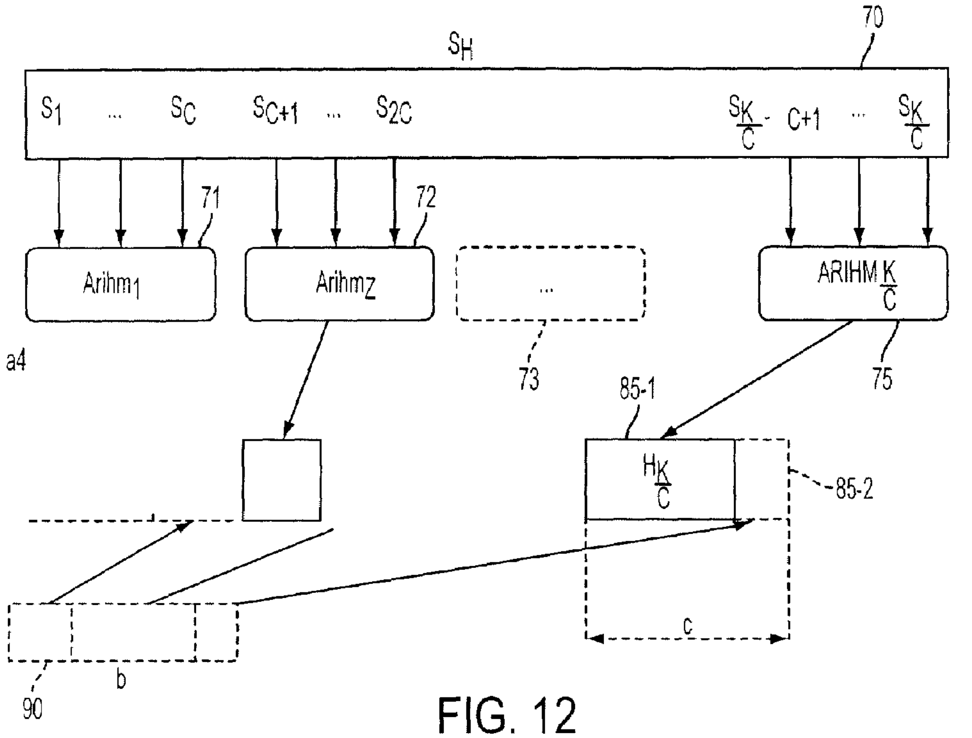

Other features and advantages of the invention will become apparent upon examination of the following detailed description together with the attached drawings in which:

FIG. 1 is a flow diagram illustrating a code creation method,

FIG. 2 is a diagram giving an overview of the encoding method in its principal variant, FIG. 2A illustrates a simplified example of a multiplexed code, with four elements, FIG. 2B illustrates a variant of the code constructed in FIG. 2A, FIG. 3 illustrates a first embodiment of a detailed encoding method, FIG. 4 illustrates an alternative embodiment of the method in FIG. 3, FIG. 5 illustrates an example of the creation of a storage capacity by assigning several code words to a symbol, a data flow q being capable of being jointly stored, and FIG. 6 or Table C illustrates transformations used in an example where the parameter $f_v$ is equal to 5, FIG. 7 illustrates another simplified example of a four-element multiplexed code, FIG. 8 illustrates a general encoding method for FIGS. 3 and 4, FIG. 9 illustrates a second embodiment of a detailed encoding method, FIG. 10 illustrates a results table of a first variant of the second embodiment of the encoding method according to FIG. 9, FIG. 11 illustrates an overview of a second variant of the second embodiment of the encoding method according to FIG. 9, FIG. 12 illustrates an overview of a third variant of the second embodiment of the encoding method according to FIG. 9.

In addition:

Appendix 1 contains expressions used in the present description, and

Appendix 2 contains natural language algorithms used in the present description.

The drawings and the appendices essentially include elements that are certain in character. They will therefore serve not only to aid understanding of the description, but will also contribute to the definition of the invention, as applicable.

In a general manner, a compression system for multimedia signals (image, video, audio, voice) uses statistical codes also termed variable length codes. These make it possible to obtain data rates approaching what the specialists refer to as "signal entropy". The codes most widely used in existing systems (particularly in the standards) are Huffman codes which have been described in the following paper: D. A. Huffman: "A method for the construction of minimum redundancy codes", Proc. IRE, 40 (1951), p. 1098–1101.

More recently, there has been renewed interest in arithmetic codes owing to their increased performance in compression terms. In effect these codes make it possible to decouple the encoding method from the supposed source model. This facilitates the use of higher-order statistical models. These arithmetic codes have been described in research papers such as J. J. Rissanen "Generalized kraft inequality and arithmetic", IBM J.Res. Develop., 20:198–203, May 1976

J. J. Rissanen, "Arithmetic coding as number representations", Acta Polytech. Scand. Math., 31:44–51, December 1979 and in American patents U.S. Pat. Nos. 4,286,256, 4,467,317, 4,652,856.

Until recently, the design of compression systems was undertaken assuming a guaranteed quality of transport service. It was assumed in fact that the lower layers of the OSI model incorporate error correction codes ensuring a quasi-null residual error rate as seen by the application.

Variable length codes could therefore be widely used despite their considerable sensitivity to transmission noise. Any error in the binary train can cause de-synchronization of the decoder and therefore propagation of errors to the decoded information stream.

To mitigate this propagation problem, the first-generation standards (H.261, H.263, MPEG-1, MPEG-2) incorporated synchronization markers into the syntax of the transmitted binary train. These are long code words (16 or 22 bits composed of a string of 15 or 21 bits set to '1' followed by a '0') which cannot be emulated by errors occurring in the other code words and which can therefore be recognized by the decoder with a probability close to '1'.

This leads to the binary train being structured in packets delimited by these synchronization markers. This enables the propagation of errors to be confined within a packet. However if an error occurs at the start of the packet the rest of the packet may be lost. Moreover, the frequency of these synchronization markers must be restricted to avoid undue loss of compression efficiency.

This hypothesis of quasi-null residual error rate no longer holds true in wireless and mobile networks in which the channel characteristics vary over time (non-stationary channels). This residual error rate seen by the source signal decoder is often far from negligible.

The new standards (H.263+ and MPEG-4) then adopted reversible variable length codes (RVLC). A particular feature of these codes is that they can be decoded from the first to the last bit in a packet, and inversely from the last to the first bit in the packet.

If an error has occurred in the middle of a packet, this code symmetry makes it possible to confine the error propagation to a segment in the middle of the packet instead of propagating it to the end of the packet delimited by a synchronization marker. However, the code symmetry results in a loss of compression efficiency in the order of 10% compared with a Huffman code. In addition, reversible variable length codes do not completely overcome the problem of error propagation: if an error occurs at the start and end of a packet, the whole packet is liable to be erroneous.

The design of codes that are both efficient in compression terms (i.e. approaching entropy of the source) while at the same time being robust relative to transmission noise, is therefore an important goal, in particular for future multimedia (image, video, audio, voice) mobile communications systems. New standards are being developed for these systems both within the ITTU (International Telecommunication Union) and ISO (International Organization for Standardization).

Although standards play a predominant role in the telecommunications sector, such a family of codes could also find applications in niche markets calling for proprietary solutions.

In a general manner, the digital data compression methods proposed below are implemented by a digital data compression encoder according to the invention including an encoding module and a processing module.

More specifically, an encoding module establishes a match between symbols in a first data flow and code words, wherein for certain symbols there exist several words, termed redundant, corresponding to the same symbol. In a general manner, an encoding module can be any form of storage presenting the match defined above, any form of representation of this match, or any coding function calculating this match. Thus, by way of example only, the encoding module can be an encoding table, an encoding tree or an arithmetic encoder depending on the compression methods detailed below.

The processing module implements the stages of the data compression methods based on the first data flow and a second data flow and the encoding module. The processing module includes functions capable of performing certain steps in the processes and can include a transformation of a binary flow into a multi-valued variable flow. These functions include a function for calculating or reading a multiplexing capacity associated with the first data flow, and a function for extracting part of the second data flow. These functions will be developed more particularly in the rest of the description. In a symmetrical manner, the data decompression methods are implemented by a decoder according to the invention.

In a general manner, the method described below involves creating fixed length codes for higher priority source data (flow $s_H$), by assigning several code words to each possible representation of this source.

Thus, to transmit a symbol, it is possible to choose from the different possible representations of the latter. This choice, which is a multi-valued variable, defines a storage capacity that will be capable of being used to jointly transmit other data (Cf. example in FIG. 5 detailed below). These are data of lesser importance, represented by a flow denoted $s_L$, which will be represented via multiple representation of the symbols.

FIG. 1 shows the method of creating these codes, more precisely the method of creating multiplexed codes.

At step 100, the higher priority source, $s_H$, takes its values from an alphabet of Ω elements, which can be defined by formula (E1) attached. It is assumed that the probability law μ of occurrence of the symbols in this alphabet is known. The notation $\mu_i$ represents the probability associated with symbol $a_i$ in the alphabet of the source $s_H$, as represented by formula (E2).

The method of creating codes illustrated in FIG. 1 can then be broken down into 2 main steps:

- For each symbol $a_i$, selection of the number $N_i$ of code words assigned to this symbol,
- Assignment of code words to the symbols.

The first step involves the selection of code parameters c and $(N_i)$ broken down into different steps 120, 130, 140 and 150.

At step 120-1, a code word length parameter c, in number of bits, is chosen. In a first embodiment (in reference to FIGS. 2A and 5), the parameter c takes the value c=4. In another embodiment (in reference to FIGS. 2B, 7 and 10), the parameter c takes the value 3. This defines $2^c$ code words at step 120-2, to be allocated between the symbols of alphabet A.

Depending on the possible values of the probability $\mu_i$ at step 130-1, the alphabet A symbol set is partitioned into two subsets $A_m$ and $A_M$ respectively at step 130-2 and at step 130-3. The first is the symbol set $a_i$ of which the probability $\mu_i$ is less than or equal to $1/2^c$, the second is its counterpart in A. The cardinals of these sets are respectively denoted $\Omega_m$, and $\Omega_M$.

At step 140, the probability law $\bar{\mu}$ is then calculated on the symbols of $A_M$. It is given by formula (E3).

At step 150-1, the number of code words per symbol is then chosen so as to verify approximately formula (E4), under the constraint of formula (E5) for the subset $A_M$. A conventional optimization algorithm may be used for this purpose. At step 150-2, the number of code words per symbol is determined for the symbol set of alphabet A.

In a variant of the code creation method including steps 120, 130, 140 and 150, a further step is added after step 150, and steps 120-1 and 150-1 respectively take the following form.

Let $f_1=2$, $f_2=3$, $f_3=5$ . . . , $f_v$, v be first prime numbers. In addition to parameter c at step, 120-1, a prime number $f_V$ is also chosen from these prime numbers.

At step 150-1, the procedure is the same, but with the addition of a further constraint at step 150-11 on the choice of the number of code words $N_i$ associated with each symbol: the decomposition into prime factors of all the $N_i$ must not contain a prime factor greater than $f_V$.

After step 150-1, the decomposition of each $N_i$ into prime factors is then carried out, and for any $N_i$ the number of times that each prime factor $f_j$, with $1 \leqq j \leqq v$ occurs in this decomposition is calculated. This number is denoted $\alpha_{i,j}$, where i denotes the symbol $a_i$ considered and j denotes the prime number $f_j$ considered. The correspondence between $a_i$ and the numbers $\alpha_{i,1} \ldots \alpha_{i,v}$ can be stored in a table termed the "alpha table".

The additional step entails allocating code words to the symbols. This step is broken down into different steps 160 and 180 described below.

At step 160, binary labeling (0000, 0001, . . . ) of the symbols arranged, by way of example only, in a lexicographic sequence is carried out. This make it possible to assign $N_i$ code words to the different symbols, the parameter $N_i$ being an integer determined at the preceding step (150-2). The set of code words thus associated with a symbol $a_i$ is referred to as the $a_i$ equivalence class, and denoted $C_i$ at step 180.

A value between 0 and $N_i-1$, here referred to as a state, is then assigned to the code words of each equivalence class. This value identifies the code word within the equivalence class.

Thus, each code word $c_i$ is associated with a symbol $a_i$ and a state variable between 0 and $N_i-1$, as illustrated by the expression (E6).

An example of a code thus constructed is given in Table A, FIG. 2A for $f_v=5$ and c=4. For each symbol $a_i$ in column 13-A, Table A includes a column 11-A including the classes $C_i$, a column 12-A including the code words assigned to each class, a column 14-A including the numbers $N_i$ of code words per class, a column 15-A including the probabilities $\mu_i$ associated with each class, and a column 16-A including a state q of each code word in a class. In this example, the symbols $a_i$ include 4 elements of the alphabet.

A variant of the code constructed is given in Table B, FIG. 2B for $f_v=2$ and c=3. Table B defines a binary multiplexed code, i.e. a multiplexed code such that for any symbol $a_i$ the cardinal $N_i$ of the associated equivalence class is an integer power of 2. If we denote this power $1_i$, the cardinal $N_i$ of the equivalence class verifies E(11). For each symbol $a_i$ in column 13-B, Table B includes a column 11-B including the classes $C_i$, a column 12-B including the code words assigned to each class, a column 14-B including the numbers $N_i$ of code words per class. In this example, the state variable q does not exist but other elements are present and their function will be better understood by reading the description: a column 15-B includes the probabilities $\mu_i$ each assigned to a class, a column 18-B includes a number Di of bits capable of being stored, Di being associated with each class, a column 17-B includes a set $\overline{U_i}$ of Di bits for each code word in a class. In this example, the symbols $a_i$ include 4 elements of the alphabet with i taking the values between 1 and 4.

The condition (E11) on the cardinals of the equivalence classes leads to the fact that the choice of a code word within an equivalence class makes it possible to store a whole number of bits equal to the base 2 logarithm of the cardinal of the equivalence class. This number of bits Di can therefore be written according to (E12). Di represents a multiplexing capacity of a given symbol. Tables A and B are encoding tables, also referred to as multiplexed code word tables or multiplexed code table.

In a third alternative embodiment, a binary multiplexed code can also be constructed from a binary encoding tree associated with a code word prefix, this prefix being of variable length and shorter than a maximum length being the height of the tree, such as the Huffman code presented in FIG. 7. The relationship "lower" is to be understood to mean "lower or equal". The tree is first divided into two branches respectively taking the value 1 and the value 0. In a recurrent manner, each branch of the tree is divided into two branches respectively taking the value 0 and the value 1. The parameter c is given by the height of the tree, i.e. by the length of the longest prefix (in the example c=3) of the tree. An equivalence class $C_i$ is defined by a set of fixed-length code words each having a common first part, termed common prefix. This common prefix is the part of the code word with variable length used to represent the symbol $a_i$ and denoted in FIG. 7 by the path formed by the successive branches shown as a solid line. For certain solid-line paths representing a symbol $a_i$, there remain a certain number of dotted-line paths each representing a second part of the code word termed suffix. The suffix of a code word defines the bit set Ui as indicated by an arrow in the drawing.

Thus, the encoding tree is defined as an encoding module, matching the symbols of the priority data flow and code words, wherein for certain symbols there exist several words, termed redundant, corresponding to the same symbol. These code words are of fixed length and include a first and a second code word part, for example a prefix and a suffix of variable lengths. In a variant, the first and the second code word part can correspond respectively to the suffix and prefix of the code word. More generally, a code word can include several code parts.

FIGS. 2 and 3 illustrate the coding method, also termed encoding.

The encoding method is broken down as follows:

- steps 1: the data flow of lower importance $s_L$ at step 1-1 is encoded in a binary sequence $b=(b_1, b_2, \ldots, b_{KB})$ using a reversible encoding at step 1-2. For this purpose, a Huffman type reversible encoder or arithmetic encoder (non restrictive) can be used. This gives rise to the generation of a sequence of bits, denoted b at step 1-3.
- steps 2: from the sequence of symbols $s_1, s_2, \ldots, s_{KH}$ of the flow $s_H$ at step 2-1 and reading the table of multiplexed code words at step 2-2, the associated values $n_1, n_2, \ldots, n_{KH}$ are derived at step 2-3. For example, for a symbol $s_1$ corresponding to the symbol $a_i$ in a table of multiplexed code words, $n_1$, takes the value of $N_i$ corresponding to the representation of the symbol $a_i$.
- steps 3: the value $\Lambda$, is derived, here using formulae (E7) at step 3-1. The number $K'_B$ of bits which it will be possible to store using the intrinsic redundancy of the multiplexed codes is calculated using formula (E8) at step 3-2. This number $K'_B$ of bits, represents the multiplexing capacity of the flow $s_H$ for this encoding method.
- steps 4: on condition that $K_B<K_{B'}$ at step 4-1, $K'_B$ bits of flow b, for example the last $K'_B$ bits of flow b (steps 4-2, 4-3) are used to calculate (step 4-4) a long integer $\gamma$ (step 4-5), given here by formula (E9). This corresponds to the transformation of the last $K'_B$ bits of the binary flow into a global variable. If the condition $K_B<K_{B'}$ is not verified at step 4-1, the process resumes at step 2-1 by reducing the value $K_H$ (step 4-11).
- steps 5: the value $\gamma$ can then be used to calculate the states $q_t$, $1\leqq t\leqq K_H$ (step 5-2), using for example a generalized Euclidian decomposition method (step 5-1), as illustrated in the attached algorithm (A1). This involves generating a flow of states $q_t$, $q_t$ being a multi-valued variable.
- steps 6: for any t such that $1\leqq t\leqq K_H$, knowing the symbol $s_t$ and the state $q_t$ calculated at the preceding step enables the code word to be chosen from the table of multiplexed code words (step 6-1). The multiplexed flow m is obtained including the code words $m_1$ to $M_{KH}$ (step 6-2).
- steps 7: the $K_B$–$K'_B$ bits of the flow of lower importance (step 7-1) are then concatenated to the sequence of multiplexed code words previously constructed (step 7-2) to form the transmitted flow (step 7-3).

At least step 3 is implemented by the calculation function of the processing module. Steps 4, 5 and 6 at least are implemented by the extraction function of the processing module.

In a general manner, for an encoding method, an associated decoding process is carried out by performing operations that are the reverse of those of the encoding method.

A variant of the encoding method is illustrated in FIG. 4 and avoids performing calculations on long integers. The variant of the encoding method is broken down as follows:

- steps 21 these correspond to steps 1 in FIG. 3
- steps 22: these correspond to steps 2 in FIG. 3.
- steps 23: the total number of times that each prime factor $f_j$ appears in the set of decompositions into factors of the sequence of variables $N_t$ is then determined from the so-called "alpha" table (steps 23-1 and 23-2). This number is denoted $d_j$ below, and represents the number of $f_j$-valued variables that can be multiplexed with the flow $s_H$. Thus, for each prime factor $f_j$, $d_j$ represents the sum of $\alpha_{t,j}$ in the sequence of variables $n_t$.
- steps 24: the transformations that will be used to transform the binary train into these $f_j$-valued variables are then chosen (step 24-1). These transformations depend on the value of $f_v$ chosen. The transformations used for $f_v=5$ are presented in Table C of FIG. 5.

They are presented in the form illustrated in the attached formulas (E10).

Thus, each transformation Tz takes $u_{Tz}$ bits at the input (denoted below $U_T$ by simplification for a given z) and transforms them respectively into $v_{T,1}, v_{T,2}, \ldots, v_{T,v}$ variables 2, 3, 5, . . . , $f_v$-valued. In the example in Table C for $f_v=5$, each transformation Tz in column 31 takes $u_T$ bits in column 32 as input and transforms them respectively into $v_{T,1}, v_{T,2}, v_{T,3}$ variables 2, 3, 5-valued in columns 33, 34, 35. The required number of variables of each type is known: for each type of variable $f_j$, it is $d_j$ (Cf. step 23-2).

The attached algorithm A2 can be used to calculate the number $g_{Tz}$ of times that the transformation T z must be used (step 24-2), for a variable z ranging from 0 to $z_{max}$. (It is assumed that the transformations are arranged in descending order of relevance in the table).

step 25: $K_{B'}$, the number of multiplexed bits, is calculated by obtaining the product of the number of times $g_{Tz}$ that a transformation Tz must be used and the number of bits $u_T$ at the input of the transformation and adding these products together for all the transformations z used. This number $K'_B$ of bits represents the multiplexing capacity of the flow $s_H$ for this encoding method. This step 25 corresponds to steps 3 in FIG. 3. The following steps 26-1, 26-2, 26-3, and 26-11 correspond to steps 4-1, 4-2, 4-3 and 4-11 in FIG. 3.

steps 27: having chosen the number of transformations of each type to be used, they are applied to the end of the binary flow b (step 27-1).

For each transformation Tz, the $u_T$ input bits are seen as the binary representation of an integer e.

This integer is then decomposed into several $f_j$-valued variables, as indicated in the formulas (E10). These variables are denoted $e_{r,j}$, where:

j indicates that the value obtained is the representation of an $f_j$-valued variable, and r indicates the number of the $f_j$-valued variable.

Values of $e_{r,j}$ can be obtained from e using the method of algorithm A3. This algorithm is reiterated a number $g_{Tz}$ of times for each transformation Tz.

On completion of this step 27-1, the results obtained are presented in the form of formulas (E10) and are concatenated so as to obtain v sequences of available variables (step 27-2):

the first, denoted $F_1$, is a sequence with a length $d_1$ of 2-valued variables (bits), the j-th, denoted $F_j$, is a sequence with a length $d_j$ of $f_j$-valued variables. Position pointers, denoted $t_j$, are assigned to the sequences, and are initially positioned at the start of each sequence.

steps 28: the flow of states (step 28-1) is calculated from these variables, the result of which is (step 28-2):

$q=(q_1, q_2, \ldots, q_{KH})$.

This calculation may be performed by proceeding as follows:

for any t such that $1 \leqq t \leqq K_H$, and thus for each symbol $s_t$, the decomposition into prime factors of $n_t$ makes it possible to determine the number $\alpha_{tj}$ of variables of each type (2-valued, . . . , $f_j$-valued, . . . , $f_v$-valued, j ranging from 1 to v). Each sequence $F_j$ previously obtained is divided into $K_H$ successive segments comprising $\alpha_{tj}$ bits for t ranging from 1 to $K_H$. The process is reiterated for j ranging from 1 to v. Each $n_t$-valued variable ($q_t$) is obtained by the reciprocal process of iterative Euclidian decomposition, applied to the segments $F_{tj}$ of $f_j$-valued variables. An example of implementation of this process is described by algorithm A4. It will be noted that at the end of these steps 28, all the variables of the flows $F_j$ have been used.

steps 29: for any t such that $1 \leqq t \leqq K_H$, knowing the symbol $s_t$ and the state $q_t$ calculated at the preceding step enables the code word to be chosen from the table of multiplexed code words (step 29-1). The multiplexed flow m is then obtained (step 29-2).

steps 30: the $K_H$-$K'_H$ bits of the flow of lower importance (step 30-1) are then concatenated to the sequence of multiplexed code words previously evaluated (step 30-2). The transmitted flow is obtained (step 30-3).

At least step 25 is implemented by the calculation function of the processing module. At least step 27 is implemented by the extraction function of the processing module.

The encoding methods presented in reference to FIGS. 2, 3 and 4 can be generalized according to the encoding process in FIG. 8:

based on the table of multiplexed code words and the sequence of symbols $s_H$, the associated values $n_1$, $n_2$, . . . , $n_{KH}$ are calculated so as to calculate the multiplexing capacity $K'_B$ of the sequence of symbols $s_H$ at step I.

the pre-encoded flow b is divided into two parts b' and b" at step II in relation to the multiplexing capacity $K'_B$, the part b' of the flow is transformed into a series of states q using the values $n_1, n_2, \ldots, n_{KH}$ at step V, based on this series of states q and the table of multiplexed code words, the multiplexed code words are selected at step VII, these code words are assembled to form a multiplexed flow m at step VIII, the concatenated part b" of the flow b is concatenated with the multiplexed flow m at step IX.

At least step I is implemented by the calculation function of the processing module. At least step II is implemented by the extraction function of the processing module.

An example of the creation of a storage capacity according to the invention is illustrated in FIG. 5. Thus, for each symbol $s_t$ in the data flow $s_H$ a corresponding class $C_t$ and the associated code words $C_{t,q}$ are assigned relative to an encoding table. Each state $q_t$ of a data flow q can be jointly stored after selection of the code word $c_{t,qt}$ from the table of multiplexed code words.

In the case of conversion of the lower priority binary train, the variant of the encoding method with $f_v=2$ can be used. Another variant described below in reference to FIG. 9 can advantageously be used. Table B in FIG. 2B is used in this example.

The part of the conversion process for the binary train therefore consists of the following steps:

step 40: corresponds to steps 1 in FIG. 3.

step 42: The associated value $D_t$ is derived by reading the symbol $s_t$ and reading the table of binary multiplexed codes. This value $D_t$ corresponds to the number of bits that can be jointly encoded with $s_t$. $D_t$ is a multiplexing capacity of a given symbol.

step 44: the next $D_t$ bits of the pre-encoded binary train b are read. It will be noted that the binary train is read progressively in relation to a positioning pointer. These next $D_t$ bits are denoted $\overline{u_t}$ and play the same role as the states ($q_t$).

step 46: the code word $c_{st}$, $\overline{ut}$ is selected from the table of binary multiplexed codes as a function of the symbol $s_t$ and the bits $\overline{u_t}$, the table being indexed by $a_i$ and $\overline{U_i}$. This code word is transmitted on the channel, step 48: for each symbol $s_t$ of the flow $s_H$, with t in the range from 1 to $K_H$ steps 42 to 46 are performed.

At least step 42 is implemented by the calculation function of the processing module. At least step 44 is implemented by the extraction function of the processing module.

By way of an example of application of the process in FIG. 9, the highest priority sequence to be transmitted $s_H=a_H\ a_2\ a_2\ a_3\ a_2\ a_1\ a_2\ a_4\ a_1\ a_2$, of length $K_H=10$, and the low priority pre-encoded binary train b=0101010101010, are considered. The number of bits that can be multiplexed with each representation of $s_H$ is given, for t ranging from 1 to $K_H$, by $(D_t)=(1, 2, 2, 0, 2, 1, 2, 0, 1, 2)$. The number of bits $d_t$ in the binary train b is read progressively for t ranging from 1 to $K_H$ so as to obtain the sequences $\overline{u_t}$ of bits $(\overline{u_1}, \ldots, \overline{u_{KH}})$=(0, 10, 10, ø, 10, 1, 01, ø, 0, 10). Then, for any t, the combination ($a_t$, $\overline{u_t}$) indexes a code word in the binary multiplexed code table. The binary train effectively transmitted is 000 100 100 110 001 011 111 000 100.

As a variant, the process in FIG. 9 can also use the encoding tree. In this variant, steps 42 to 46 take the following form:

- step 42: by reading the symbol $S_t$ and reading the binary encoding tree, the code word prefix for the symbol $s_t$ is obtained. The number of bits in this prefix is used to derive the number of bits $D_t$ that can be jointly encoded with $s_t$ to form a sequence of bits having a total length equal to the height of the encoding tree. $D_t$ is a multiplexing capacity of a given symbol.
- step 44: the next $D_t$ bits of the pre-encoded binary train b are read. It will be noted that the binary train is read progressively in relation to a positioning pointer. These next $D_t$ bits are denoted $\overline{u_t}$.
- step 46: the code word transmitted on the channel results from the concatenation of the code word prefix for the symbol $s_t$ and the bits $\overline{u_t}$ of the binary train b. Thus, utilization of the binary train b enables a choice to be made between the possible code words shown as dotted lines on the encoding tree in FIG. 7 for a given symbol.

At least step 44 is implemented by the extraction function of the processing module.

By way of example, using the sequence $s_H$ and the binary train b indicated previously in the case of FIG. 10 and the encoding tree in FIG. 7 to determine the code word prefixes, the code word flow $m_t$ is obtained by concatenation of the prefixes and suffixes $\overline{u_t}$.

In a general manner, the encoding tree makes it possible to define a code word prefix for each symbol in the flow $s_H$, which is equivalent to defining several possible code words for certain symbols. The choice between these possible code words will be made once the binary code to determine the code word suffix has been read and the code word has been formed by concatenation of the prefix and suffix. Calculation of the sum of the set of $D_t$ associated with the symbols forming the flow $s_H$ makes it possible to determine the multiplexing capacity of the flow $s_H$.

Other variants of the encoding method are illustrated below in reference to FIGS. 11 and 12.

It may be useful to consider creating a multiplexed code not on the alphabet but on a "product alphabet". The term "product alphabet", refers to an alphabet composed not of symbols but sequences of symbols. In the example in FIG. 11, the source $s_H$ 50 comprises K symbols. It is converted into a C-uplet source denoted H (of length K/C these C-uplets being designated H1, H2, H3, . . . $H_{K/C}$ and respectively numbered 51, 52, 53 and 55. Any C-uplet of symbols has the probability of occurrence (E13). It is used to derive the calculation of the probability distribution $\mu_H$ associated with the C-uplets. The binary encoding tree (termed "product binary encoding tree") is created by considering, for each C-uplet, the probabilities of occurrence of each sequence of length C given in (E13). The code word prefix associated with a sequence of symbols is read from the encoding tree.

According to FIG. 11, for each sequence of symbols the multiplexing function 62 comprises a certain number of functions performing the steps corresponding to the variant process in FIG. 9. At each step, the "symbol" is replaced by a "sequence of symbols". Thus, the encoding method using an encoding tree is applied directly to the C-uplet representations of the source H.

If alphabet A is too large to be able to use an encoding tree, it is also possible to replace "the product encoding tree" by an arithmetic code as illustrated in FIG. 12. Thus, the source $s_H$ 70 is divided into C-uplets, which leads to a number of C-uplets equal to K/C. These C-uplets can be relatively long and are encoded by independent arithmetic (non restrictive) encoders. In the example in FIG. 12, each C-uplet is encoded by a separate arithmetic encoder 71, 72, 73 and 75. The output of these arithmetic encoders consists of sequences $H_1$, $H_2$, $H_{K/C}$ of variable length bits numbered 81-1, 82-1, 85-1. The length c of the code words corresponds to the longest possible sequence of bits Ht at the output of the arithmetic encoders. Each sequence of bits is then seen as a code word prefix. For each prefix of length strictly shorter than the length c, there exist several code words of length c corresponding to the same symbol.

The formation of a code word is the same as in the "product alphabet" variant. Thus, the encoded binary flow b numbered 90 is read progressively to form the suffixes 81-2, 82-2, 85-2 thereby complementing the prefixes 81-1, 82-1, 85-1 and forming the multiplexed code words. If the number K/C is not an integer, the last C'=K−C [K/C] symbols form a C'-uplet which is encoded arithmetically.

As indicated for FIG. 9, the number of bits in a prefix is used to derive the number of bits $D_t$ ($1<t<K$) that can be jointly encoded with $H_t$ to form a sequence of bits having a total length equal to the height of the encoding tree. $D_t$ is a multiplexing capacity of a given sequence of symbols. Calculation of the sum of the set of $D_t$ associated with the symbol sequences forming the source H makes it possible to determine the multiplexing capacity of the flow $s_H$.

In a general manner, an arithmetic encoder or an encoding tree can be used to establish a code word prefix for each, sequence of symbols, which is equivalent to defining several possible code words for certain symbol sequences. The choice between these possible code words will be made once the binary code to determine the code word suffix has been read and the code word has been formed by concatenation of the prefix and suffix.

Thus, the invention allows multiplexing of two data flows $s_H$ and $s_L$, in order to reduce the error sensitivity of one of them $s_H$, designated as more important or higher priority. These two flows can be differentiated in the same signal source, in particular as in the following examples of $s_H$ and $s_L$ sources:

- low frequencies and high frequencies extracted by multi-resolution decomposition (filter banks, wavelet transforms) of a signal,
- texture information (e.g. DCT coefficients, wavelet coefficients) and movement information,
- most significant bits and least significant bits of wavelet coefficients or quantified samples of a signal.

Of course, the above enumeration is in no way exhaustive.

Furthermore, in that the code words are of fixed length (or if synchronization markers are used), the invention can be used to create a multiplexed code capable of jointly describing two flows, at least one of which has the benefit of perfect synchronization.

Appendix 1—Formulas $$A = \{\alpha_1, \ldots, \alpha_i, \ldots, \alpha_\Omega\} \quad \text{(E1)}$$

$$\mu_i = P(a_i) \quad \text{(E2)}$$

$$\tilde{\mu}_i = \frac{2^c}{2^c - \Omega_M}\mu_i \quad \text{(E3)}$$

$$N_i = (2^c - \Omega_m) * \tilde{\mu}_i \quad \text{(E4)}$$

$$\sum_{i \in A} N_i = 2^c \quad \text{(E5)}$$

$$c_{i,j} \rightleftarrows (s_i, q_j) \quad \text{(E6)}$$

$$\Lambda = \prod_{t=1}^{K_H} n_t \quad \text{(E7)}$$

$$K'_B = \lfloor \log_2(\Lambda) \rfloor \quad \text{(E8)}$$

-continued $$\gamma = \sum_{r=1}^{K_H} b_{r+K_B-K'_B} 2^{4-1}. \quad \text{(E9)}$$

$$u_\tau bits \rightleftarrows \begin{cases} \upsilon_{\tau,1} 2\text{- valued variables} & e_{1,1}, e_{2,1}, \ldots, e_{\upsilon_{\tau,1},1} \\ \upsilon_{\tau,2} 3\text{- valued variables} & e_{1,2}, e_{2,2}, \ldots, e_{\upsilon_{\tau,2},2} \\ \ldots & \\ \upsilon_{\tau,1} fvi\text{- valued variables} & e_{1,\upsilon}, e_{2,\upsilon}, \ldots, e_{\upsilon_{\tau,\upsilon},\upsilon} \end{cases} \quad \text{(E10)}$$

$$\forall\ i \in [1 \ldots \Omega],\ \exists\ l_i \in \mathbb{N} / N_i = 2^{l_i} \quad \text{(E11)}$$

$$D_i = \log_2(N_i) = c - l_i \quad \text{(E12)}$$

$$P(S_t S_{t+1} \ldots S_{t+C-1}) = P(S_t) P(S_{t+1} / S_t) \ldots P(S_{t+C-1} / S_{t+C-2}) \quad \text{(E13)}$$

Appendix 2—Algorithms

A1

$$\gamma' = \gamma$$

For $t = 1 : K_H$ $q_t = \gamma'$ modulo $n_t$ $$\gamma' = \frac{\gamma' - q_t}{n_t}$$

End for

A2

$z = 0$

% while $fj$ – valued variables remain to be obtained

While sum $(d_j) > 0$

% Calculate the number of times that the transformation $\tau_z$ is used $$g\tau_z = floor\left(\min\left(\frac{d_j}{\upsilon_{\tau_{z,j}}}\right)\right) \upsilon_{\tau_{z,j}} \neq 0$$

% Calculate the number of $f_j$ – valued variables

% which have not been transformed by the transformation $\tau_z$

For each $j$ between 1 and $v$ $d_j = d_j - g\tau_z * \upsilon_{\tau_{z,j}}$

%

$z = z + 1$

-continued $$A3\left|\begin{array}{c} e' = e \\ \text{For } j = 1{:}v \\ \text{For } \tau = 1{:}v_{\tau,j} \\ e_{r,j} = e' \text{ modulo } f_j \\ e' = \dfrac{e' - e_{r,j}}{f_j} \\ \text{End for} \\ \text{End for} \end{array}\right.$$

$$A4\left|\begin{array}{c} \text{For } j = 1{:}v \\ tj = 1 \\ \text{End for} \\ \text{For } t = 1{:}K_H \\ q_t = 0 \\ \text{For } j = v{:}1 \text{ by } -1 \\ \text{For } \tau = 1{:}\alpha_{t,j} \\ \text{qt} = q_t * f_j + F_j(t_j) \\ tj = tj + 1 \\ \text{End for} \\ \text{End for} \\ \text{End for} \end{array}\right..$$

The invention claimed is:

1. Digital data compression encoder, characterized in that it includes:

an input for a first data flow ($s_H$), and a second data flow ($s_L$), an encoding module, matching symbols of the first data flow and code words, wherein, for certain symbols, there exist several words, called redundant, corresponding to the same symbol, and a processing module for encoding the symbols of the first data flow based on the match, by selecting among the redundant words, on the basis of at least part of the second data flow.

2. Encoder according to claim 1, characterized in that the code words are of fixed length.

3. Encoder according to claim 1, characterized in that the processing module includes:

a function to calculate the current multiplexing capacity of the first data flow ($s_H$), based on the encoding module, and a function to extract a multiplexed part from the second data flow ($s_L$), determined on the basis of the current multiplexing capacity, to be carried by said redundant words.

4. Encoder according to claim 1, characterized in that it includes a transformation of a binary flow into a multi-valued variable flow.

5. Encoder according to claim 4, characterized in that it includes a transformation of a binary flow into a multi-valued variable flow, in particular using the transformations described in Table C.

6. Encoder according to claim 5, characterized in that it includes a transformation of a binary flow into a multi-valued variable flow, in particular using a generalized Euclidian decomposition based on a global variable given by the relationship (E9).

7. Encoder according to claim 1, characterized in that the encoding module includes an encoding table and in that the processing module includes:

a function to read a multiplexing capacity of each current symbol of the first data flow ($s_H$) based on the encoding table and a function to extract a part of the second data flow ($s_L$) determined from the multiplexing capacity, to be carried by said redundant words.

8. Encoder according to claim 7, characterized in that the encoding table includes, for each symbol, an associated number of code words equal to a power of 2.

9. Encoder according to claim 1, characterized in that the encoding module includes a binary encoding tree containing, for each symbol in the first data flow, a first code word part, of variable length and shorter than a maximum length, and in that the processing module includes:

a function to compute the multiplexing capacity for each current symbol of the first data flow ($s_H$) based on the first code word part of each symbol, a function to extract a part of the second data flow ($s_L$) determined from the multiplexing capacity, to be carried by said redundant words.

10. Encoder according to claim 9, characterized in that each symbol comprises a sequence of symbols.

11. Encoder according to claim 9, characterized in that said part of the second data flow is concatenated with the first code word part up to the maximum length of the code word.

12. Encoder according to claim 1, characterized in that each symbol comprises a sequence of symbols, in that the encoding module includes an arithmetic encoder designed to calculate, for a symbol sequence in the first data flow, a first code word part of variable length and shorter than a maximum length, and in that the processing module includes:

a function to calculate the multiplexing capacity for each current symbol of the first data flow ($s_H$) based on the first code word part of each symbol, a function to extract a part of the second data flow ($s_L$) determined from the multiplexing capacity for each symbol, to be carried by said redundant words.

13. Encoder according to claim 1, characterized in that the second data flow is pre-encoded.

14. Encoder according to claim 1, characterized in that the rest of the second data flow is concatenated with the transmitted data.

15. Decoder designed to perform the inverse operations relative to those of the encoder according to claim 1.

16. Digital data compression method, characterized by:

a. establishing a match between symbols of the first data flow and code words, wherein, for certain symbols, there exist several words, termed redundant, corresponding to the same symbol, and b. encoding the symbols of a first data flow based on the match obtained at step a., by selecting among the redundant words, on the basis of at least part of a second data flow, characterized by sub-functions according to claim 1.

17. Digital data compression method, characterized by the following steps:

a. establishing a match between symbols of the first data flow and code words, wherein, for certain symbols, there exist several words, termed redundant, corresponding to the same symbol, and b. encoding the symbols of a first data flow based on the match obtained at step a., by selecting among the redundant words, on the basis of at least part of a second data flow.

18. Digital data decompression method, characterized by steps reciprocal to those of the method according to claim 17.

* * * * *